US012804841B2

(12) United States Patent
Wu et al.

(10) Patent No.: US 12,804,841 B2
(45) Date of Patent: Nov. 17, 2026

(54) SERVER

(71) Applicant: Giga Computing Technology Co., Ltd., New Taipei City (TW)

(72) Inventors: Chun Liang Wu, New Taipei City (TW); Ching Chuan Huang, New Taipei City (TW); Chao Hsiang Huang, New Taipei City (TW); Hsin-Yu Chang, New Taipei City (TW); Yu-Bin Lin, New Taipei City (TW); Yi-Ming Lee, New Taipei City (TW); Yu-Ping Lee, New Taipei City (TW)

(73) Assignee: GIGA COMPUTING TECHNOLOGY CO., LTD., New Taipei City (TW)

( * ) Notice: Subject to any disclaimer, the term of this patent is extended or adjusted under 35 U.S.C. 154(b) by 75 days.

(21) Appl. No.: 19/005,242

(22) Filed: Dec. 30, 2024

(65) Prior Publication Data

US 2026/0059690 A1 Feb. 26, 2026

(30) Foreign Application Priority Data

Aug. 22, 2024 (TW) ................................ 113131536

(51) Int. Cl.
*H05K 7/14* (2006.01)

(52) U.S. Cl.
CPC ................................. *H05K 7/1492* (2013.01)

(58) Field of Classification Search
CPC ........................... H05K 7/1487; H05K 7/1492
See application file for complete search history.

(56) References Cited

U.S. PATENT DOCUMENTS

| | | | | |
|---|---|---|---|---|
| 2013/0120941 A1* | 5/2013 | Peterson | H05K 7/1492 29/401.1 |
| 2015/0208543 A1* | 7/2015 | Chen | H05K 7/1489 361/679.39 |

FOREIGN PATENT DOCUMENTS

| | | |
|---|---|---|
| CN | 203562562 U | 4/2014 |
| TW | 201607409 A | 2/2016 |

OTHER PUBLICATIONS

Taiwanese Office Action and Search Report for Taiwanese Application No. 113131536, dated Jun. 3, 2025.

* cited by examiner

*Primary Examiner* — Robin J Mishler
(74) *Attorney, Agent, or Firm* — Birch, Stewart, Kolasch & Birch, LLP

(57) ABSTRACT

A server includes a housing, a first sliding component, and a first power socket. The first sliding component is arranged in the housing and adjacent to a first side surface of the housing, and slides parallel to the first side surface. The first power socket is arranged in the first sliding component and has an opening toward a second side surface of the housing, wherein the second side surface is perpendicular to the first side surface.

8 Claims, 10 Drawing Sheets

400

SERVER

CROSS REFERENCE TO RELATED APPLICATIONS

The present application claims priority of Taiwan Patent Application No. 113131536, filed 22 Aug. 2024, which is incorporated by reference herein in its entirety.

BACKGROUND OF THE INVENTION

Field of the Invention

The present invention relates to a server, more particularly to an AC power socket inside the server.

Description of the Related Art

AC power sockets in conventional servers are usually configured side by side. However, when performing other elements'layout, the layout is usually limited by configuration and size of the AC power sockets, and space within the server may not be effectively utilized.

BRIEF SUMMARY OF THE INVENTION

Therefore, an embodiment of the present disclosure provides a server, which includes a sliding component and at least one AC power socket arranged in the sliding component. By arranging the sliding component can save space inside the server and effectively improve space utilization, thereby improving the overall performance of the server.

An embodiment of the present disclosure provides a server, which includes a housing, a first sliding component, and a first power socket. The first sliding component is arranged in the housing and adjacent to a first side surface of the housing, and slides parallel to the first side surface. The first power socket is arranged in the first sliding component and has an opening toward a second side surface of the housing, wherein the second side surface is perpendicular to the first side surface.

According to some embodiments of the present disclosure, the server further includes a second power socket, which is arranged in the first sliding component, and has an opening toward the second side surface, wherein the second power socket is arranged farther away from the second side surface than the first power socket.

According to some embodiments of the present disclosure, when viewed along a first direction that is perpendicular to the first side surface, the first power socket and the second power socket do not overlap. When viewed along a second direction that is perpendicular to the second side surface, the first power socket and the second power socket at least partially overlap. The first power socket and the second power socket do not overlap when viewed along a third direction, the third direction is perpendicular to a top surface of the housing, and the top surface is perpendicular to the first side surface and the second side surface.

According to some embodiments of the present disclosure, the server further includes at least one second sliding component, which is arranged in the housing and adjacent to the first sliding component, and slides parallel to the first side surface. The at least one second sliding component is provided with at least one power socket respectively. The at least one second sliding component is arranged closer to or farther from the top surface than the first sliding component.

According to some embodiments of the present disclosure, the server further includes at least one third sliding component, which is arranged in the housing and adjacent to the first sliding component, and slides parallel to the first side surface. The at least one third sliding component is provided with at least one power socket respectively. The at least one third sliding component is arranged closer to or further from the first side surface than the first sliding component.

According to some embodiments of the present disclosure, the server further includes a limiting structure, which extends along the first direction. The first sliding component is provided with a sliding groove, and the limiting structure penetrates into the sliding groove.

According to some embodiments of the present disclosure, the sliding groove has a first size in the second direction, and a slidable range of the first sliding component is the first size.

According to some embodiments of the present disclosure, the server further includes a first power cord, which is connected to the first power socket and has a first length, wherein the first length is more than twice the first size.

According to some embodiments of the present disclosure, the first sliding component is provided with an engaging assembly, and the engaging assembly includes a positioning elastic piece and a push rod. The positioning elastic piece has a fixed portion, a connecting portion and an engaging portion. The fixed portion is fixed to the first sliding component. The connecting portion connects the engaging portion and the fixed portion. The engaging portion is engaged with the housing. The push rod is connected to the connecting portion of the positioning elastic piece and protrudes from the housing along the second direction.

According to some embodiments of the present disclosure, the engaging portion protrudes along the first direction and engages with a partition of the housing, and the partition is parallel to the first side surface. When a force toward the first side surface is applied to the push rod, the connecting portion of the positioning elastic piece deforms, and the engaging portion moves away from the partition and is released from engagement.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
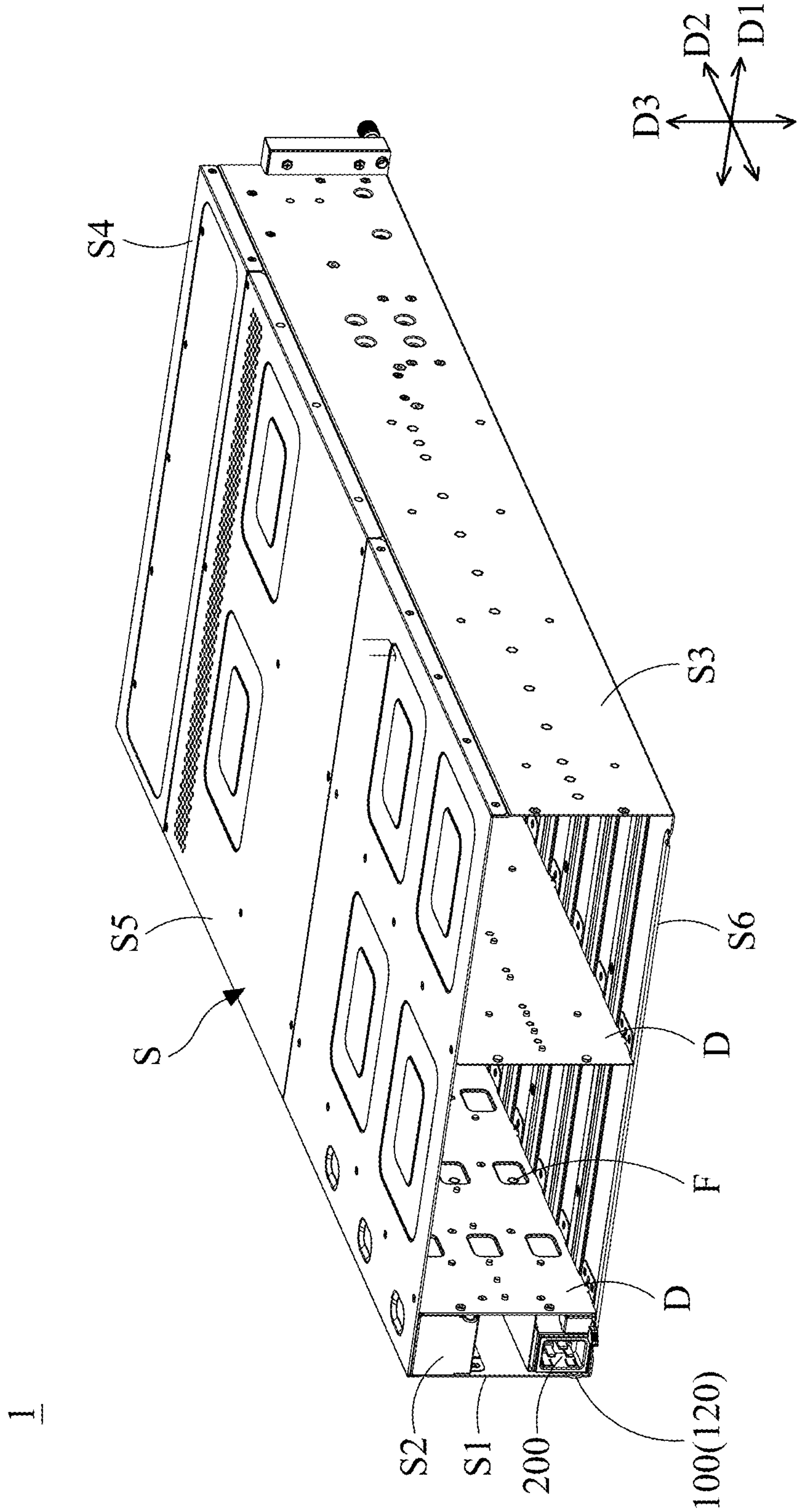
FIG. 1 is a perspective view of a server according to an embodiment of the present disclosure.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept can be embodied in various forms without being limited to those exemplary embodiments. In addition, the drawings of different embodiments can use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

In this specification, relative expressions are used. For example, "lower", "bottom", "higher" or "top" are used to describe the position of one element relative to another. It should be appreciated that if a device is flipped upside down, an element at a "lower"side will become an element at a "higher"side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about"or "substantially".

Figure 2:
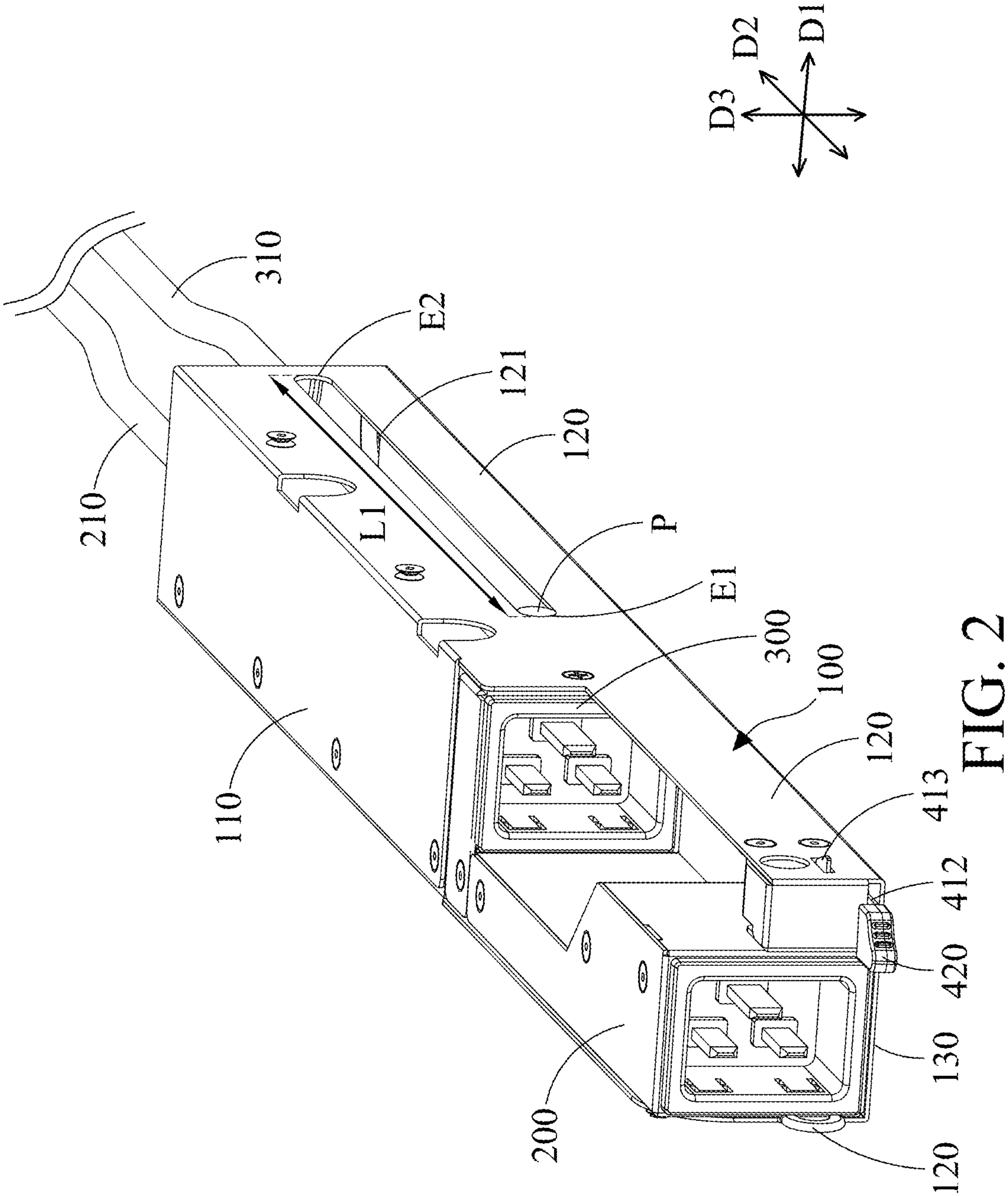
FIG. 2 is a perspective view of partial components of the server according to an embodiment of the present disclosure.

Refer to FIG. 1 and FIG. 2. FIG. 1 is a perspective view of a server 1 according to an embodiment of the present disclosure. FIG. 2 is a perspective view of partial components of the server 1 according to an embodiment of the present disclosure. In this embodiment, the server 1 includes a housing S, a first sliding component 100, a first power socket 200, and a second power socket 300.

The housing S is a rectangular cuboid with a hollow structure to accommodate various elements therein. The housing S includes a first side surface S1, a second side surface S2, a third side surface S3, a fourth side surface S4, a top surface S5, and a bottom surface S6. The first side surface S1 and the third side surface S3 are parallel to each other and perpendicular to a first direction D1. The second side surface S2 and the fourth side surface S4 are parallel to each other and perpendicular to a second direction D2. The top surface S5 and the bottom surface S6 are parallel to each other and perpendicular to a third direction D3. The top surface S5, the first side surface S1 and the second side surface S2 are perpendicular to each other.

The housing S may also include a plurality of partitions D to separate multiple spaces, so that different elements may be arranged in different spaces. For example, element arranged in a space between two partitions D may be different from another element arranged in another space between one partition D and the third side surface. In order to clearly illustrate the main elements of this embodiment, the elements in the above two spaces are not shown. As shown in FIG. 1, there are two partitions D arranged in the housing S, but the number and arrangement of the partitions D are not limited to this, and may be changed as needed.

As shown in FIG. 1 and FIG. 2, the first sliding component 100 is arranged in the housing S and adjacent to the first side surface S1 of the housing S, and may slide parallel to the first side surface S1, that is, slide along the second direction D2. In this embodiment, the first sliding component 100 is a roughly rectangular cuboid with a hollow structure, and has a top wall 110, two side walls 120, and a bottom wall 130. The two side walls 120 are perpendicular to the first direction D1. The top wall 110 and the bottom wall 130 is perpendicular to the third direction D3. The first power socket 200 and the second power socket 300 are accommodated in this hollow structure.

The first sliding component 100 is arranged between the first side surface S1 and the partition D. Two sliding grooves 121 are respectively arranged in the two side walls 120 of the first sliding component 100. Two limiting structures F respectively penetrate into the two sliding grooves 121 from the first side surface S1 and the partition D, so as to limit a slidable range of the first sliding component 100.

In more detail, the limiting structures F may be, for example, rivets, which are respectively nailed to the first side surface S1 and the partition D, and respectively penetrate into the two sliding grooves 121. Either of the sliding grooves 121 has an elongated shape, and its long side has a first size L1 in the second direction D2. Two ends of the long side are respectively a first end E1 and a second end E2. When the first sliding component 100 is initially fixed in the housing S, the first end E1 of the sliding groove 121 abuts against the limiting structures F. When the first sliding component 100 is pulled out from the housing S along the second direction D2 and slide by the first size L1, the second end E2 of the sliding groove 121 abuts the limiting structures F and may not be pulled out anymore. That is, the slidable range of the first sliding component 100 is the first size L1.

The first power socket 200 and the second power socket 300 are fixedly arranged in the first sliding component 100, and have openings toward the second side surface S2 of the housing S. That is, socket openings of the first power socket 200 and the second power socket 300 face the second side surface S2 of the housing S, so that an external plug may be inserted into the first power socket 200 and the second power socket 300 from the second side surface S2. In this embodiment, the first power socket 200 and the second power socket 300 are AC power sockets.

Figure 3:
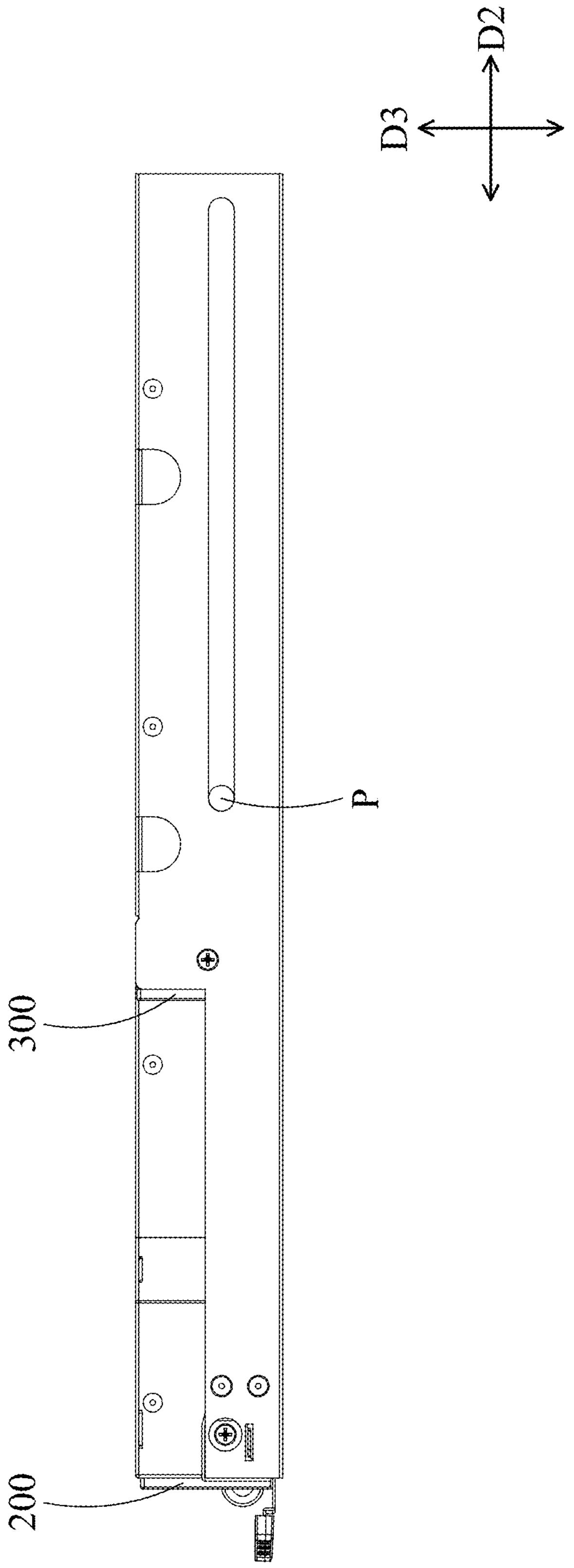
FIG. 3 is a side view of partial components of the server according to an embodiment of the present disclosure.
Figure 4:
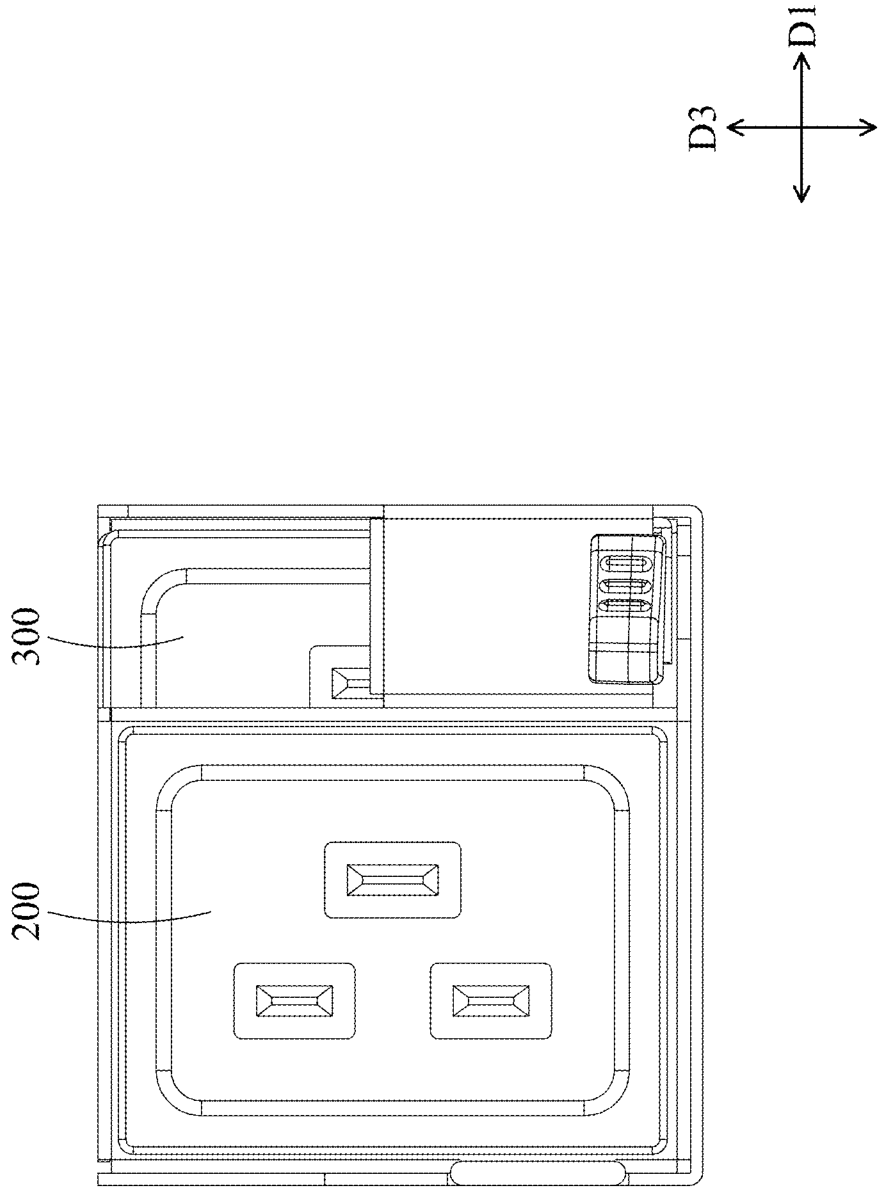
FIG. 4 is a front view of partial components of the server according to an embodiment of the present disclosure.
Figure 5:
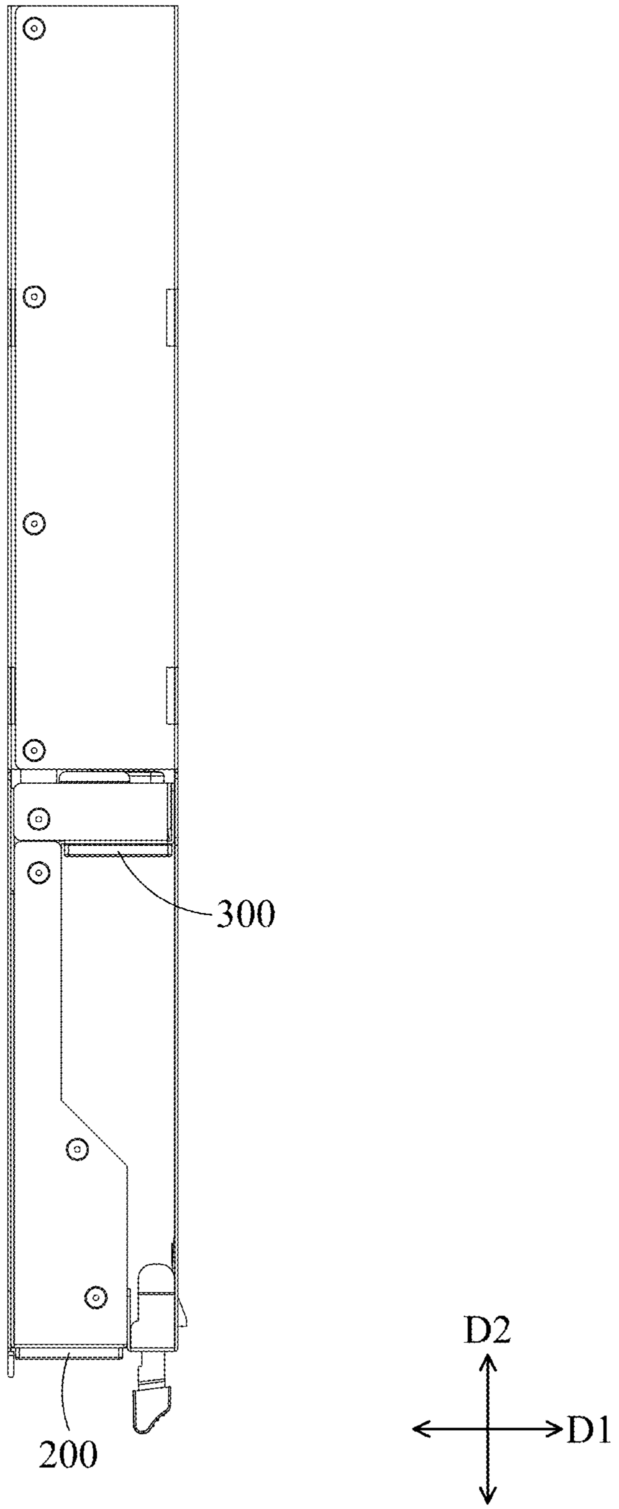
FIG. 5 is a top view of partial components of the server according to an embodiment of the present disclosure.

The second power socket 300 is arranged further away from the second side surface S2 than the first power socket 200. In more details, refer to FIG. 3 to FIG. 5, FIG. 3 is a side view of partial components of the server 1 according to an embodiment of the present disclosure. FIG. 4 is a front view of partial components of the server 1 according to an embodiment of the present disclosure. FIG. 5 is a top view of partial components of the server 1 according to an embodiment of the present disclosure. As shown in FIG. 3, when viewed along the first direction D1 that is perpendicular to the first side surface S1, the first power socket 200 and the second power socket 300 do not overlap. As shown in FIG. 4, when viewed along the second direction D2 that is perpendicular to the second side surface S2, the first power socket 200 and the second power socket 300 at least partially overlap. As shown in FIG. 5, when viewed along the third direction D3 that is perpendicular to the top surface S5, the first power socket 200 and the second power socket 300 do not overlap.

Therefore, in contrast to the conventional two AC power sockets that are arranged side-by-side in the first direction D1, in this embodiment of the present disclosure, arranging the first power socket 200 and the second power socket 300 one behind the other and partially overlapping in the second direction D2 may save space in the first direction D1, and the saved space can be used for more appropriate purposes.

In addition, in this embodiment, the first power socket 200 is closer to the first side surface S1 than the second power socket 300, but it is not limited to this. The second power socket 300 may be arranged to be closer to the first side surface S1 than the first power socket 200.

Back to FIG. 2, the first power socket 200 and the second power socket 300 are respectively connected to a first power cord 210 and a second power cord 310 on a side opposite to the opening. The first power cord 210 and the second power cord 310 are connected to a power supply (not shown) within the server 1. The first power cord 210 has a first length, the second power cord 310 has a second length, and the first length is more than twice the first size L1, and the second length is also more than twice the first size L1. Therefore, even if the first sliding component 100 is pulled out along the second direction D2, the first power cord 210 or the second power cord 310 will not be pulled to affect the connection with the power supply.

As shown in FIG. 2, there is an accommodating space between the first power socket 200 and the second power socket 300, which may accommodate a plug (not shown) inserted into the second power socket 300. The plug is adjacent to the first power cord 210. On the other hand, plug cord (not shown) of the plug is adjacent to the first power socket 200. Therefore, in the first direction D1, a width of the first sliding component 100 is set equal to or slightly greater than a width of the second power socket 300 plus the first power cord (or a width of the first power socket 200 plus the plug cord), which may save space in the first direction D1 inside the server 1.

In the second direction D2, the first size L1 is set to be equal to or greater than a length of the first power socket 200 plus the plug. Therefore, when the first sliding component 100 is pulled out along the second direction D2 to the limit, the plug connected to the second power socket 300 may be exposed from the server 1 to facilitate plugging and unplugging.

Figure 6:
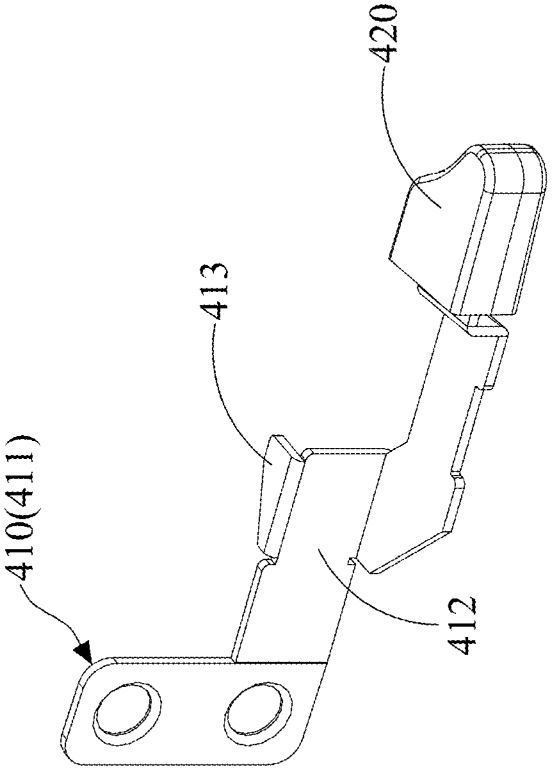
FIG. 6 is a perspective view of an engaging assembly in the server according to an embodiment of the present disclosure.
Figure 7:
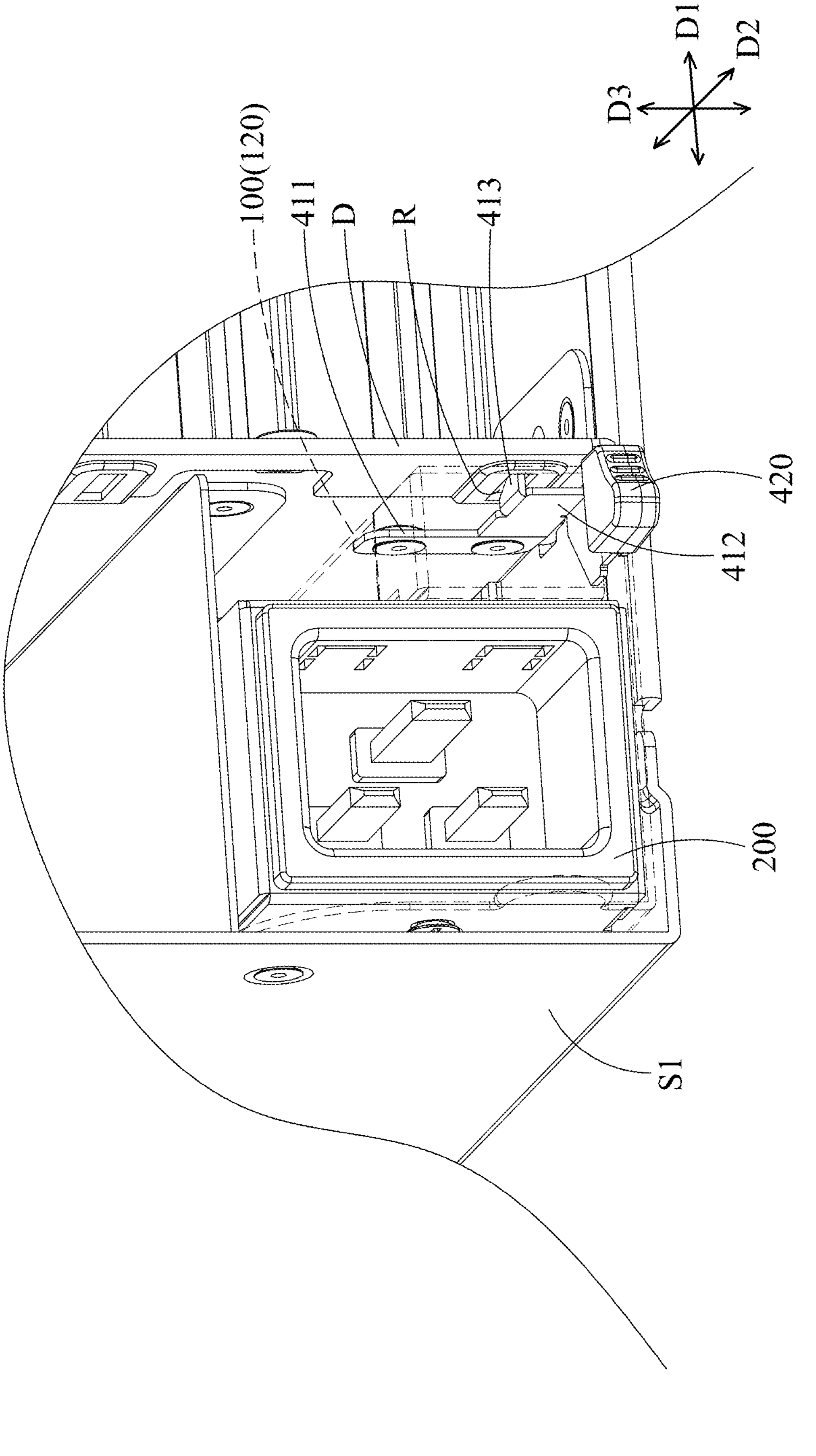
FIG. 7 is a schematic diagram of a partial structure of the server according to an embodiment of the present disclosure.

Refer to FIG. 2, FIG. 6 and FIG. 7. FIG. 6 is a perspective view of an engaging assembly 400 in the server 1 according to an embodiment of the present disclosure. FIG. 7 is a schematic diagram of a partial structure of the server 1 according to an embodiment of the present disclosure. It should be noted that in order to clearly illustrate the configuration of the engaging assembly 400 in FIG. 7, the first sliding component 100 is shown in dotted line to represent transparent. The first sliding component 100 is provided with the engaging assembly 400. The engaging assembly 400 includes a positioning elastic piece 410 and a push rod 420.

The positioning elastic piece 410 has a fixed portion 411, a connecting portion 412, and an engaging portion 413. The fixed portion is fixed to the first sliding component 100. For example, the fixed portion 411 may be fixed to a side wall 120 of the first sliding component 100 by rivets or the like. The connecting portion 412 connects the engaging portion 413 and the fixed portion 411. The engaging portion 413 is engaged with the housing S. In this embodiment, as shown in FIG. 2 and FIG. 7, the engaging portion 413 protrudes through the side wall 120 along the first direction D1 and may be engaged with a recess R of the partition D of the housing S. The push rod 420 is connected to the connecting portion 412 of the positioning elastic piece 410 and protrudes from the housing S along the second direction D2.

When a force toward the first side surface S1 is applied to the push rod 420, the connecting portion 412 of the positioning elastic piece 410 is deformed, so that the engaging portion 413 is away from the recess R of the partition D, and the engagement is released. In this case, the first sliding component 100 may be pulled out. That is, the first sliding component 100 may be engaged and fixed inside the housing by the engaging assembly 400, and when necessary, the engaging and fixing may be released by pushing the push rod 420.

Figure 8:
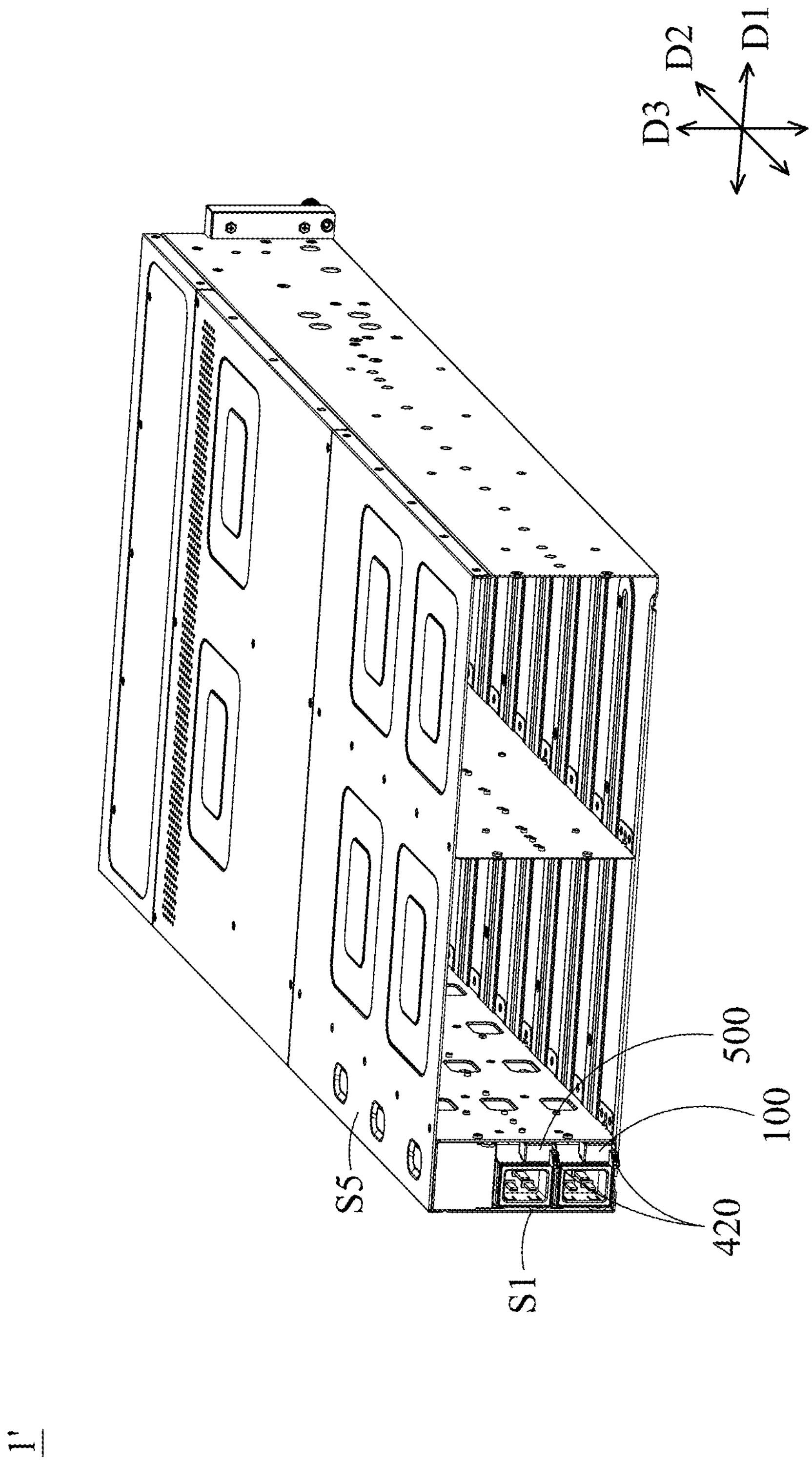
FIG. 8 is a perspective view of a server according to another embodiment of the present disclosure.
Figure 9:
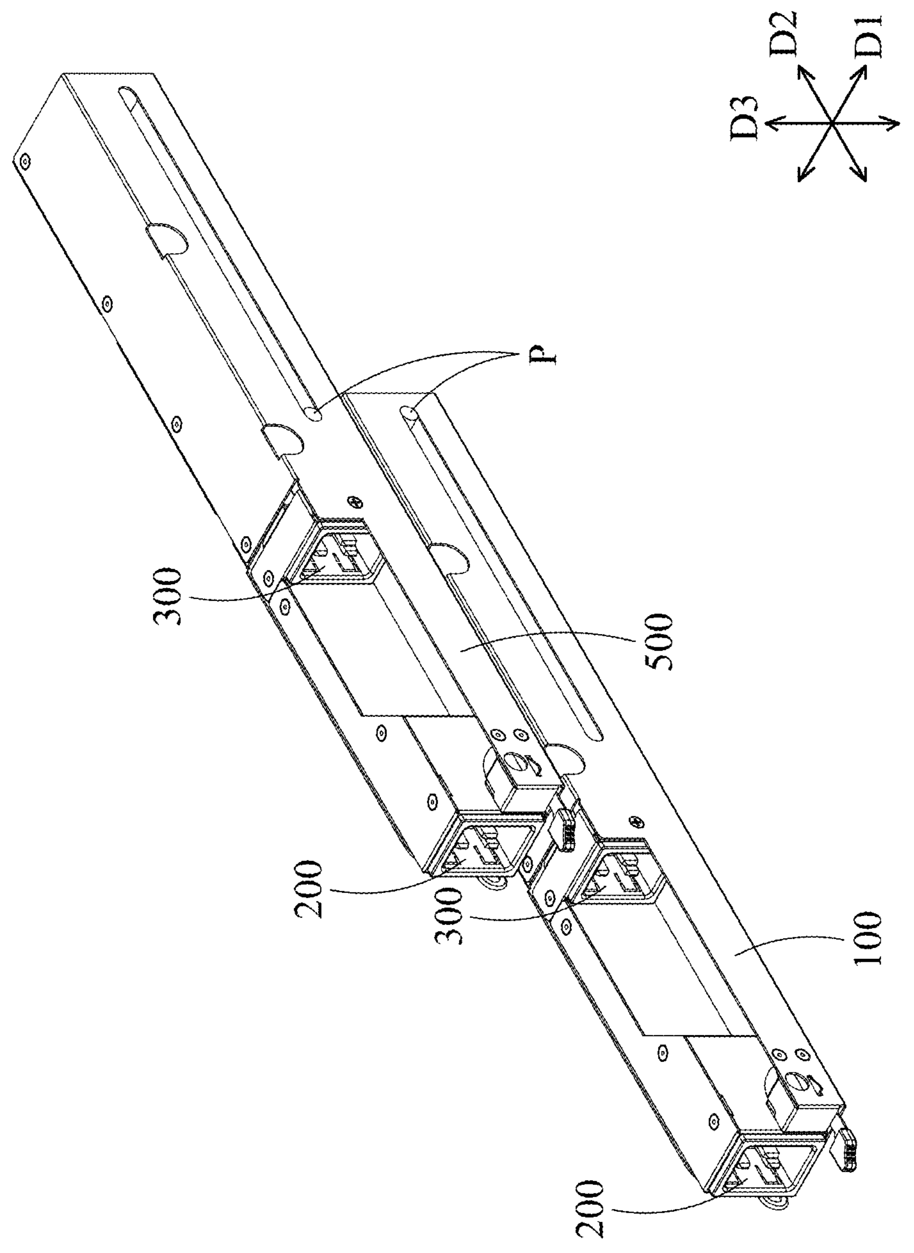
FIG. 9 is a perspective view of partial components of the server according to another embodiment of the present disclosure.

Refer to FIG. 8 and FIG. 9. FIG. 8 is a perspective view of a server 1'according to another embodiment of the present disclosure. FIG. 9 is a perspective view of partial components of the server 1' according to another embodiment of the present disclosure. In another embodiment, the server 1' may further include at least one second sliding component 500, which is arranged in the housing S and adjacent to the first sliding component 100, and slides parallel to the first side surface S1. The at least one second sliding component 500 is respectively provided with at least one power socket. The at least one second sliding component 500 is arranged closer to or farther from the top surface S5 than the first sliding component 100. In this embodiment of FIG. 8 and FIG. 9, one second sliding component 500 is provided. The second sliding component 500 is arranged closer to the top surface S5 than the first sliding component 100. Like the first sliding component 100, the second sliding component 500 is provided with two AC power sockets.

With arrangement described above, more power supplies may be connected in the third direction D3. Each of the power supplies is independent, so that it will not be affected by each other. Even if any power supply arranged in much inside the first sliding component 100 or the second sliding component 500 needs to be plugged or unplugged, just by pushing the push rod 420 to release the engagement and then pulling out the first sliding component 100 or the second sliding component 500, the power supply may be easily plugged or unplugged.

Figure 10:
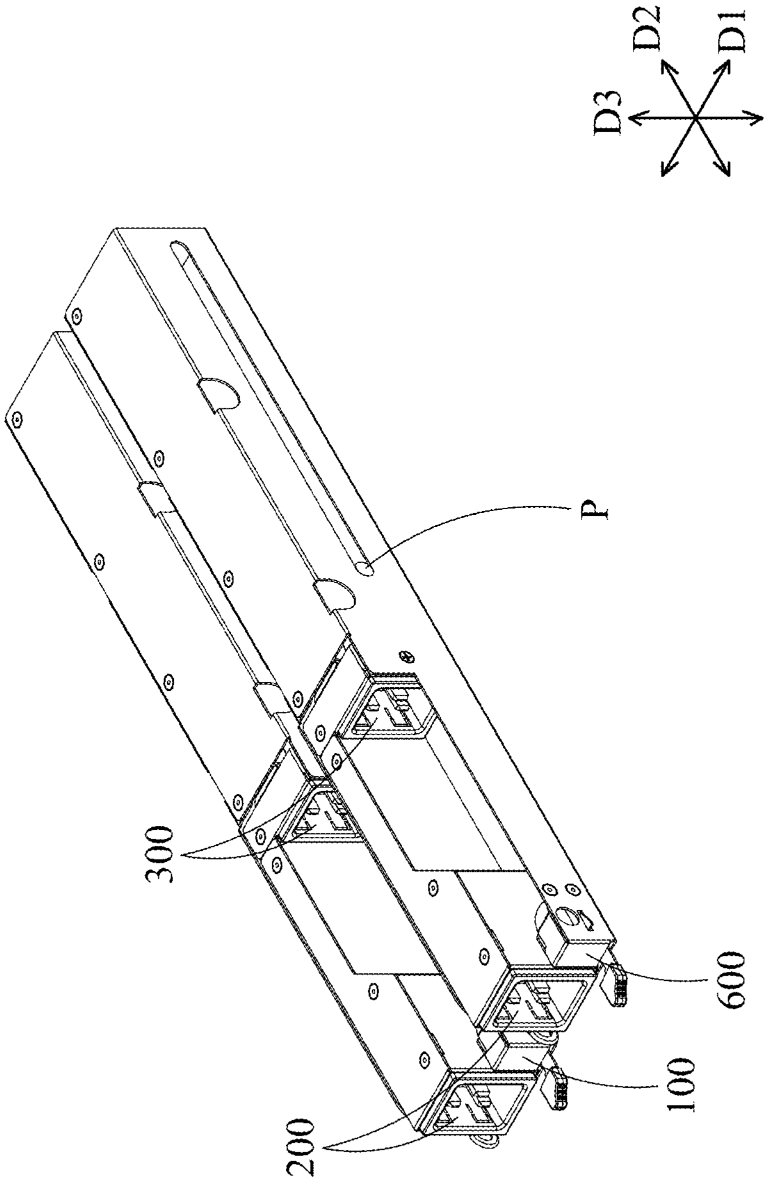
FIG. 10 is a perspective view of partial components of the server according to one another embodiment of the present disclosure.

Refer to FIG. 10, FIG. 10 is a perspective view of partial components of a server 1" according to one another embodiment of the present disclosure. In one another embodiment, the server 1" may further include at least one third sliding component 600, which is arranged in the housing S and adjacent to the first sliding component 100, and slides parallel to the first side surface S1. The at least one third sliding component 600 is respectively provided with at least one power socket. The at least one third sliding component 600 is arranged closer to or farther from the first side surface S1 than the first sliding component 100. In this embodiment of FIG. 10, one third sliding component 600 is provided. The third sliding component 600 is arranged farther away from the first side surface S1 than the first sliding component 100. Like the first sliding component 100, the third sliding component 600 is provided with two AC power sockets.

With arrangement described above, more power supplies may be connected in the first direction D1. Compared with conventional arrangement having all power supplies arranged side by side in the first direction D1, space in the first direction D1 may be saved in this embodiment. In addition, although not shown, a plurality of third sliding components 600 may be arranged in the first direction D1 and a plurality of second sliding components 500 may be arranged in the third direction D3 to achieve optimal space configuration in the server 1 and maximize the performance of server 1.

As mentioned above, embodiments of the present disclosure provide a server, which includes a housing, a first sliding component, and a first power socket. The first sliding component is arranged in the housing and adjacent to the first side surface of the housing, and slides parallel to the first side surface. The first power socket is arranged in the first sliding component and has an opening toward a second side surface of the housing, and the second side surface is perpendicular to the first side surface. Through the sliding component and the power socket provided therein, space in the server may be saved, space utilization may be effectively improved, and the overall performance of the server may be improved.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A server, including:

a housing;

a first sliding component, arranged in the housing and adjacent to a first side surface of the housing, sliding parallel to the first side surface;

a first power socket, arranged in the first sliding component, having an opening toward a second side surface of the housing, wherein the second side surface is perpendicular to the first side surface; and a second power socket, arranged in the first sliding component, having an opening toward the second side surface, wherein the second power socket is arranged farther away from the second side surface than the first power socket, wherein when viewed along a first direction that is perpendicular to the first side surface, the first power socket and the second power socket do not overlap, wherein when viewed along a second direction that is perpendicular to the second side surface, the first power socket and the second power socket at least partially overlap, wherein the first power socket and the second power socket do not overlap when viewed along a third direction, the third direction is perpendicular to a top surface of the housing, and the top surface is perpendicular to the first side surface and the second side surface.

2. The server as claimed in claim 1, further comprising at least one second sliding component, which is arranged in the housing and adjacent to the first sliding component, and slides parallel to the first side surface, wherein the at least one second sliding component is provided with at least one power socket respectively, wherein the at least one second sliding component is arranged closer to or farther from the top surface than the first sliding component.

3. The server as claimed in claim 1, further comprising at least one third sliding component, which is arranged in the housing and adjacent to the first sliding component, and slides parallel to the first side surface, wherein the at least one third sliding component is provided with at least one power socket respectively, wherein the at least one third sliding component is arranged closer to or further from the first side surface than the first sliding component.

4. The server as claimed in claim 1, further comprising a limiting structure, which extends along the first direction, wherein the first sliding component is provided with a sliding groove, and the limiting structure penetrates into the sliding groove.

5. The server as claimed in claim 4, wherein the sliding groove has a first size in the second direction, and a slidable range of the first sliding component is the first size.

6. The server as claimed in claim 5, further comprising a first power cord, which is connected to the first power socket and has a first length, wherein the first length is more than twice the first size.

7. The server as claimed in claim 1, wherein the first sliding component is provided with an engaging assembly, and the engaging assembly comprises:

a positioning elastic piece, having a fixed portion, a connecting portion and an engaging portion, the fixed portion is fixed to the first sliding component, the connecting portion connects the engaging portion and the fixed portion, and the engaging portion is engaged with the housing; and a push rod, connected to the connecting portion of the positioning elastic piece and protrudes from the housing along the second direction.

8. The server as claimed in claim 7, wherein the engaging portion protrudes along the first direction and engages with a partition of the housing, and the partition is parallel to the first side surface, wherein when a force toward the first side surface is applied to the push rod, the connecting portion of the positioning elastic piece deforms, and the engaging portion moves away from the partition and is released from engagement.

* * * * *